(12) United States Patent
Fernando et al.

(10) Patent No.: US 8,228,217 B2
(45) Date of Patent: Jul. 24, 2012

(54) FILTER FOR THE SUPPRESSION OF NOISE IN RESOLVER-TO-DIGITAL CONVERTERS

(75) Inventors: Lalinda Fernando, Burlington, MA (US); Michael Coln, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 69 days.

(21) Appl. No.: 12/846,649

(22) Filed: Jul. 29, 2010

(65) Prior Publication Data

US 2011/0304488 A1    Dec. 15, 2011

Related U.S. Application Data

(60) Provisional application No. 61/354,942, filed on Jun. 15, 2010.

(51) Int. Cl.
*H03M 1/48* (2006.01)
(52) U.S. Cl. .................. 341/116; 341/112; 341/155
(58) Field of Classification Search .......... 341/11, 341/112, 116, 120, 155; 708/300; 318/432, 318/811
See application file for complete search history.

(56) References Cited

U.S. PATENT DOCUMENTS

| | | | | |
|---|---|---|---|---|
| 7,679,309 | B2 * | 3/2010 | Schulz et al. | 318/811 |
| 7,840,364 | B2 * | 11/2010 | Nakazato | 702/58 |
| 2007/0296368 | A1 * | 12/2007 | Woodland et al. | 318/609 |
| 2009/0313313 | A1 * | 12/2009 | Yokokawa et al. | 708/300 |

OTHER PUBLICATIONS

Analog Devices, "12-Bit R/D Converter with Reference Oscillator," AD2S1200 Datasheet, Rev. 0, Oct. 2003, pp. 1-24.
Tamagawa, "Smartcoder: Angular Signal Converter IC," AU6803/AU6804 Datasheet, Dec. 2008, 2 pages.

* cited by examiner

*Primary Examiner* — Peguy Jean Pierre
(74) *Attorney, Agent, or Firm* — Kenyon & Kenyon LLP

(57) ABSTRACT

A system and method for reducing noise in resolver-to-digital converters (RDC) using a cascaded tracking loop filter. In some embodiments, one or more tracking loop filters may be implemented in a cascade to attenuate carrier harmonic frequencies in the digitized output of an RDC. Where a plurality of tracking loop filters are implemented, the output of one tracking loop filter may be input into a successive tracking loop filter.

20 Claims, 5 Drawing Sheets

100

200

500

FILTER FOR THE SUPPRESSION OF NOISE IN RESOLVER-TO-DIGITAL CONVERTERS

CROSS-REFERENCE TO RELATED APPLICATIONS

This application claims the benefit of priority to previously filed U.S. provisional patent application Ser. No. 61/354,942, filed Jun. 15, 2010, entitled FILTER ARCHITECTURE FOR SUPPRESSION OF NOISE IN RESOLVER-TO-DIGITAL CONVERTERS. That provisional application is hereby incorporated by reference in its entirety.

FIELD

Aspects of the present invention relate generally to the field of noise reduction in analog to digital converters and more specifically to filtering noise from the output of a resolver-to-digital converter in high speed applications.

DESCRIPTION OF THE RELATED ART

A resolver is a rotary transformer used to measure the position of a rotating shaft that is mechanically connected to a rotor. A Resolver-to-Digital converter (RDC) is typically an integrated circuit that measures analog signals output from a resolver and generates a digital output code representing the rotor's angular position ($\theta$). To produce accurate results, an RDC should faithfully digitize the rotor's angular position (without significant positional errors) and track the rotor's angular position in time (without inducing significant phase delays).

A conventional resolver is illustrated in FIG. 1. As shown, a resolver 100 includes three magnetically coupled inductors. A first winding 101, called the "primary," may be mounted either on the rotor 106 (FIG. 1) or on the stator (not shown). The primary 101 may be excited by carrier signal 102 with an alternating current (AC) sinusoidal signal having the form EXC=$A*\sin(\omega t)$ where A is the peak amplitude of the carrier frequency. Secondary windings 103 and 104 are mounted on the stator, magnetically orthogonal to each other, and electromagnetically coupled to the primary winding. The coupling induces voltages in the secondary windings having the form $A*\sin(\omega t)*\sin(\theta)$ and $A*\sin(\omega t)*\cos(\theta)$ respectively, where $\theta$ 105 represents the angular orientation of rotor 106. Thus, the amplitudes of the sinusoids induced at the secondary windings are a function of the relative rotor angle $\theta$ 105. The output from the resolver 100 may include two sinusoids where the magnitude of each carrier present at secondary windings 103 and 104 is modulated by the sine and cosine of the rotor angle $\theta$ 105 respectively. For this reason, the secondary windings 103 and 104 are called the sine channel and cosine channel respectively.

The RDC may apply a demodulation function to the resolver output in order to frequency shift the information from amplitude modulated to baseband. Once demodulated, a low-pass filter may be applied to attenuate out-of-band noise (i.e. carrier harmonics or converter quantization noise) and to improve signal to noise ratio (SNR). In order to accurately track the sensor angle in time, without introducing significant phase delay, the low-pass filter of the RDC is typically implemented as a low order filter with a cut-off frequency corresponding with the maximum tracking rate of the converter.

As the rate of rotation in the rotor increases, the bandwidth of the sensed signal increases. However, the bandwidth of the carrier signal cannot be adjusted significantly without detriment to the energy efficiency of the sensor. Thus the sensed signal may infringe on the carrier signal, which may cause interference and increased noise in the signal. Therefore, as the tracking rate (speed) approaches the carrier frequency (i.e. in high speed applications), the RDC may not be able to distinguish the carrier signal from the sensed signal and thus the standard low pass filter function of the RDC may be insufficient to attenuate the noise of the carrier harmonics. Thus, distortion of in-band information due to the carrier harmonics may occur and may result in positional errors when the RDC attempts to digitize the angular position. Positional errors caused by the carrier harmonics may have a significant effect on any motion control systems relying on the RDC output, which in turn may lead to mechanical jittering and undesirable vibrations.

Direct filtering of the RDC output would result in severe phase distortion. Aggressive filtering using traditional causal techniques (higher order finite impulse response (FIR) or infinite impulse response (IIR) filters for example) to attenuate carrier harmonics often create large group delays that can also cause tracking errors. Currently, RDCs in high speed applications compromise for the capability of tracking at high speeds by significantly trading off positional accuracy.

Accordingly, there is a need in the art for a system capable of attenuating the carrier harmonics of RDCs used in high-speed applications without inducing significant phase delays.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

Embodiments of the present invention provide a system and method for reducing noise caused by carrier harmonics in resolver-to-digital converter (RDC) systems without inducing significant positional errors or phase delays. Such embodiments may include a plurality of tracking loops that are coupled to an output of an RDC in cascade. During operation, when a resolver achieves a consistent rotational speed, the cascaded tracking loops lock onto an output of the RDC. By providing at least a pair of tracking loops, the loops operate in a predictive fashion to generate an output positional value ($\theta_{OUT}$) that is generally free of harmonics, jitter and delay.

Figure 1:
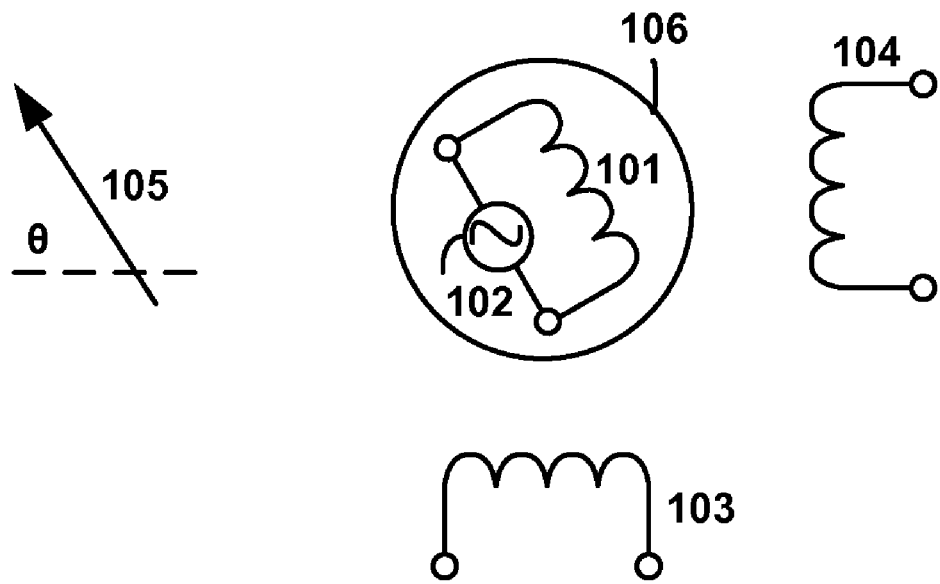
FIG. 1 illustrates a conventional resolver.
Figure 2:
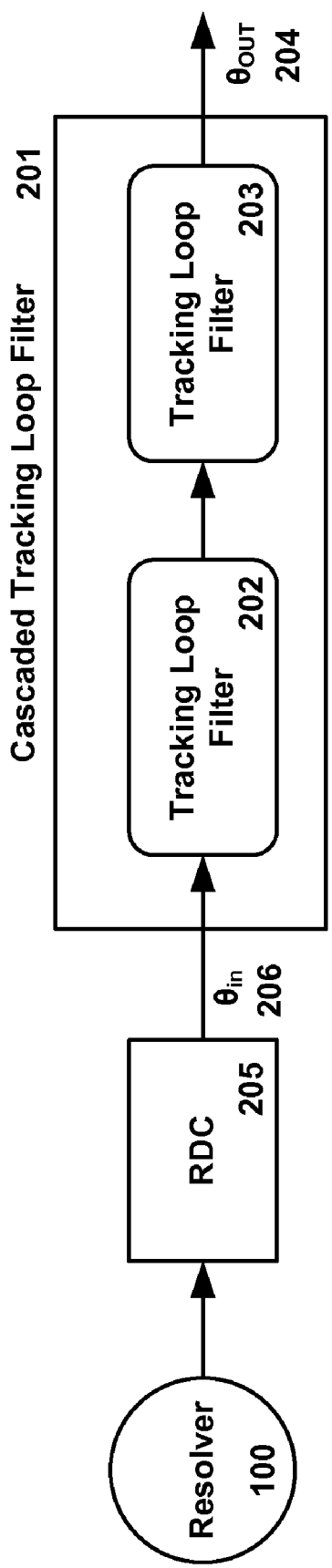
FIG. 2 is a simplified block diagram illustrating components of an embodiment of a Resolver-to-Digital Converter (RDC) system implemented with a cascaded tracking loop filter.

FIG. 2 is a simplified block diagram illustrating components of a Resolver-to-Digital Converter (RDC) system 200 according to an embodiment of the present invention. The RDC system 200 may include a resolver 100, an RDC 205 and a cascaded tracking loop filter 201. The RDC 205 may decode the resolver signal to generate a digital representation of the resolver shaft angle θin. As noted the RDC output may include harmonics and or jitter as a result of its processes. The filter system 201 may receive the digital rotor position θin from RDC 205 and may generate a filtered phase output θout. For the purposes of the present discussion, the structure of the resolver 100 are immaterial unless otherwise described. The principles of the present invention find application with resolvers of a variety of designs.

The RDC 205 may be an integrated circuit that measures the analog signals output from the sine channel and cosine channel of resolver 100 and generates a digital signal θin representing the angular position (θ) of the rotor in resolver 100. θin of RDC 205 may be a digital representation of the shaft angle of resolver 100. Under consistent conditions (e.g. at generally constant speed), in the time domain, θin may resemble a saw tooth waveform (as the phase is bounded to 360 degrees for a full rotation). Cascaded tracking loop filter 201 may be implemented in the RDC system without changing the implementation of RDC 205 so that any conventional RDC may be used. In an embodiment, the RDC 205 and the cascaded tracking loop filter 201 may be provided in a common integrated circuit.

As its name implies, the cascaded tracking loop filter 201 may be provided as two or more tracking loop filters, 202 and 203 provided in cascade. Each tracking loop filter may track the phase from the resolver 100 by implementing a causal filter with a feedback loop. Minimizing the tracking error within the feedback loop may allow the tracking loop filter to develop an accurate prediction of the phase by limiting the induced group delay. The induced group delay may be further limited where each loop filter is continuous, and the resolver's rotational velocity of the rotor is constant. The filter function of each tracking loop filter may produce −40 dB/dec roll-off. Therefore, the cascaded tracking loop filter 201 provided with two tracking loop filters, 202 and 203, may have a full transfer function of −80 dB/Dec roll-off to attenuate carrier harmonics.

A first loop filter 202 may generate sine and cosine transforms of the θin input from the RDC. Through the loop filter mechanism, the filter 202 may generate replica sinusoids that attempt to lock onto the sinusoidal transforms in frequency and phase. Similarly the second loop filter 203 may generate a second pair of sinusoidal waveforms that attempt to lock onto the replicas generated by the first loop filter 202. When the velocity of θin is constant, the loop filters 202, 203 effectively "predict" the phase of the θin input. However, the loop filter system 201 is generally insensitive to carrier harmonics that may be present in the RDC output θin and therefore, these harmonics do not propagate to the $\theta_{OUT}$ signal.

In an embodiment, the loop filters, 202 and 203 may be provided as type II tracking loops. Type II loops may provide a more effective solution than other types of filters (i.e. type I and type III), in terms of stop band attenuation, stability and group delay characteristics. In another embodiment, Type I loops may be used. Type I loops are inherently stable but they may have tracking errors at constant velocity and the effective low-pass filter roll-off may not be sufficient. Type III loops also may be used but, because they are intrinsically unstable, they may involve higher implementation costs and complexity to accommodate stabilization mechanisms.

Figure 3:
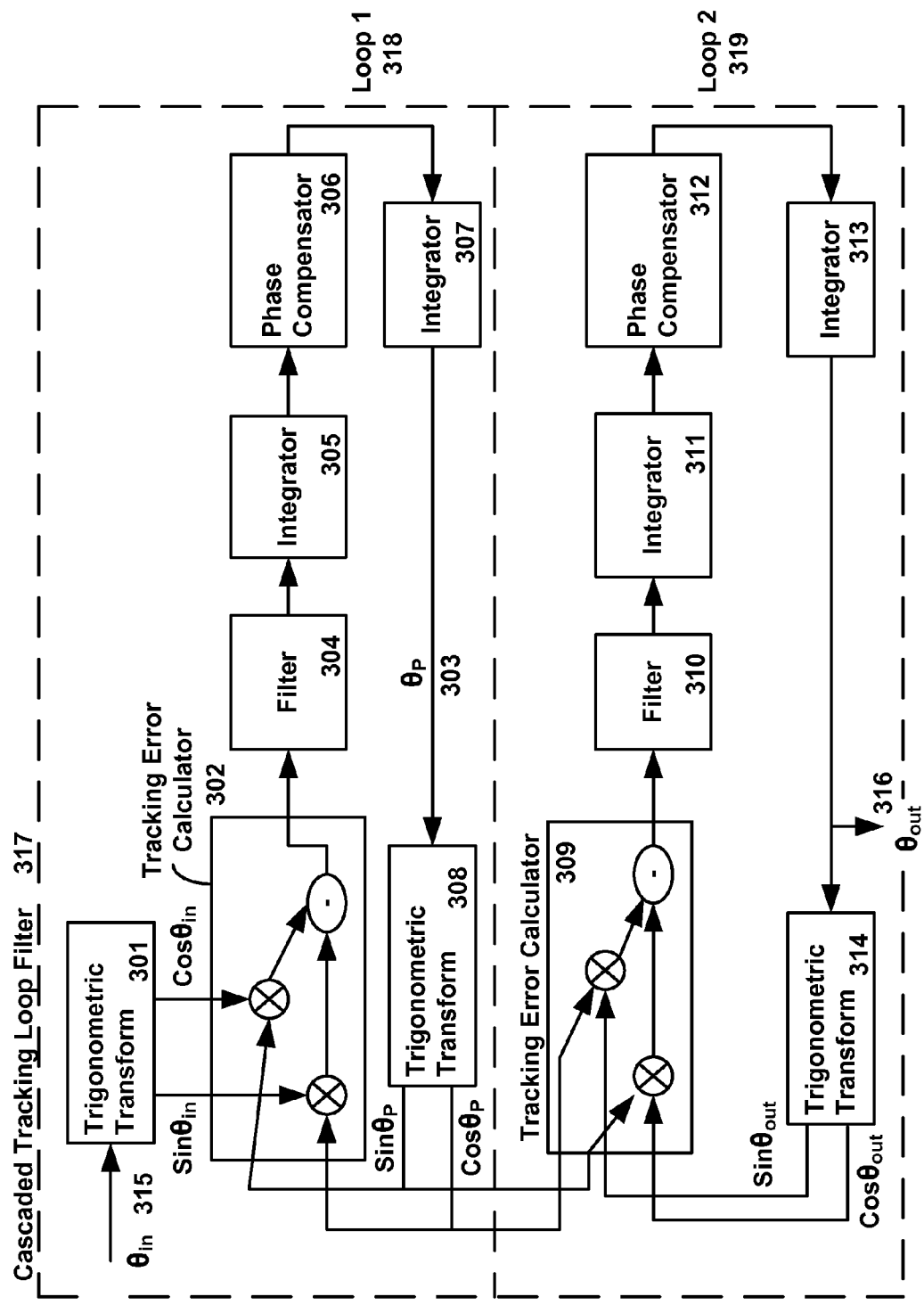
FIG. 3 is a simplified block diagram of the basic architecture of an embodiment of the proposed cascaded tracking loop filter.

FIG. 3 is a simplified block diagram of the basic architecture of an embodiment of the proposed cascaded tracking loop filter. As shown, an embodiment of a cascaded tracking loop filter 317 may include two tracking loops, loop 318 and loop 319. Each tracking loop may include trigonometric transform units 301 and 308, a tracking error calculator 302, a filter 304, integrators 305 and 307, and a phase compensator 306.

The tracking loop 318 may include a trigonometric transform 301 that may receive the input phase θin from an RDC and generate sine and cosine components therefrom. Trigonometric transform 301 may be implemented by any of a variety of transformation methods. For example, trigonometric transform 301 may be implemented with a standard direct-digital-frequency-synthesizer (DDFS) to obtain the sine and cosine trigonometric transformation of θin. The sinusoidal conversion of θin in the DDFS may then be implemented with a look up table. In an embodiment, this may be accomplished with a multi-bit trigonometric converter of, for example, 12 bits. The converter may additionally be used to increase the resolution of signal θin where the RDC uses a smaller word size than the converter by interpolating the bits for the larger word size. The trigonometric transform 301 may also have the effect of smoothing the signal thereby avoiding phase distortion that may result from direct filtering of the saw tooth output signal θin.

The tracking loop 318 may include a tracking error calculator 302. The tracking error calculator 302 may compare transformed θin with a similarly transformed predicted value of θin, θp, and may derive an error value that determines how much θin is out of phase. As shown, the tracking error calculator 302 may be implemented in accordance with equation 1.

$$\sin(\theta in)\cdot\cos(\theta p)-\cos(\theta in)\cdot\sin(\theta p)=\sin(\theta in-\theta p)=\text{tracking error} \quad \text{Eq. 1}$$

An embodiment of the tracking loop 318 may further include a filter 304 to attenuate high-frequency noise existent in θin. In an embodiment, the filter 304 may be implemented as a low pass, first order filter or other sufficient filter.

An embodiment of tracking loop 318 may include integrators 305 and 307, that each may perform a discrete time transform. Integrators 305 and 307 may further act as accumulators that allow the tracking loop 318 to create inertia within the tracking error of θin to small errors. By limiting the tracking error existent in θin, the integrators 305 and 307 may effectively attenuate the frequencies of the carrier harmonics existent in θin. The two integrators, 305 and 307, implemented in the tracking loop 318 may allow the tracking loop 318 to operate as a type II tracking filter.

As the tracking loop 318 may be implemented with a feedback loop, i.e. the output of the loop (predicted phase θp) may be fed back into the loop (as an input into tracking error calculator 302), there is a risk that oscillation may occur if the total phase shift of the loop reaches 360°. Each of the tracking error calculator 302, the integrators 305 and 307, and the filter 304 may introduce a phase shift into the signal. Therefore, tracking loop 318 may include a phase compensator 306 to prevent the total phase shift of the loop from reaching 360°.

In an embodiment, the phase compensator 306 may introduce a phase lead to stabilize the loop such that the total lead/lag in the tracking loop 318 does not reach 360°. This stability may be achieved with the introduction of a compensator zero as part of the phase compensator 306 to improve the phase margin. For example, phase compensation may be achieved with a compensator pole and compensator zero to introduce sufficient phase lead.

After the carrier harmonics and tracking error in θin has been reduced and removed from the signal, the resultant θp' may be a prediction in real time of the rotor angle of the resolver. Then a second trigonometric transform 308 may receive the predicted phase θp' from integrator 307 and determine the sine and cosine trigonometric transformation of θp'.

Then sin(θp') and cos(θp') may be fed back into the tracking error calculator 302 of the first tracking loop 318 to be combined with the next input value, θin'.

θp' may be a sufficiently accurate prediction of the rotor angle and additional tracking loop filters may not be required. However, in an embodiment as previously noted, the cascaded tracking loop filter 317 may include multiple tracking loops implemented in a cascade. The prediction of the rotor angle θp' output from the first tracking loop 318 may be utilized to monitor the cascaded tracking loop filter 317 or to determine if more or fewer tracking loops may be required. A second tracking loop 319 may be implemented with the same features of the first tracking loop 318, and the second trigonometric transform 308 of the first tracking loop 318 may also serve as the first trigonometric transform of the second tracking loop 319.

Sin(θp') and cos(θp') may then be input into the tracking error calculator 309 of a successive cascaded tracking loop filter where the second tracking loop 319 may behave as described above for the first tracking loop 318 with θp' as θin. Thus, the second tracking loop 319 may include a filter 310, integrators 311 and 313, and a phase compensator 312 implemented as in the first tracking loop 318 described above. This similarity of features may provide for a simplified implementation of multiple tracking loop filters for a post-RDC filter. θout' may then represent a prediction in real time of the rotor angle of the resolver where the carrier frequencies have been attenuated by two tracking loop filters. A third trigonometric transform 314 may then determine the sine and cosine trigonometric transformation of θout' and sin(θout') and cos(θout') may then be fed back into the tracking error calculator 309 of the second tracking loop 319 to be combined with the next θp".

As shown, an RDC system implemented with a cascaded tracking loop filter may use type II tracking loop filters, however, other loop filters may be implemented. Additionally, more or fewer loops may be implemented, with each successive loop being implemented in a similar cascaded fashion as described above.

As discussed above, FIG. 3 is a simplified block diagram of the basic architecture of an embodiment of the proposed cascaded tracking loop filter. In implementation, the filter may be embodied as a hardware system, in which case, the blocks illustrated in FIG. 3 may correspond to circuit subsystems within a filter system. The hardware implementation may be embodied in either a digital or an analog filter system. Alternatively, the filter may be embodied as a software system, in which case the blocks illustrated may correspond to program modules within a filter software program. In yet another embodiment, the filter may be a hybrid system involving both hardware circuit systems and software programs.

Figure 4:
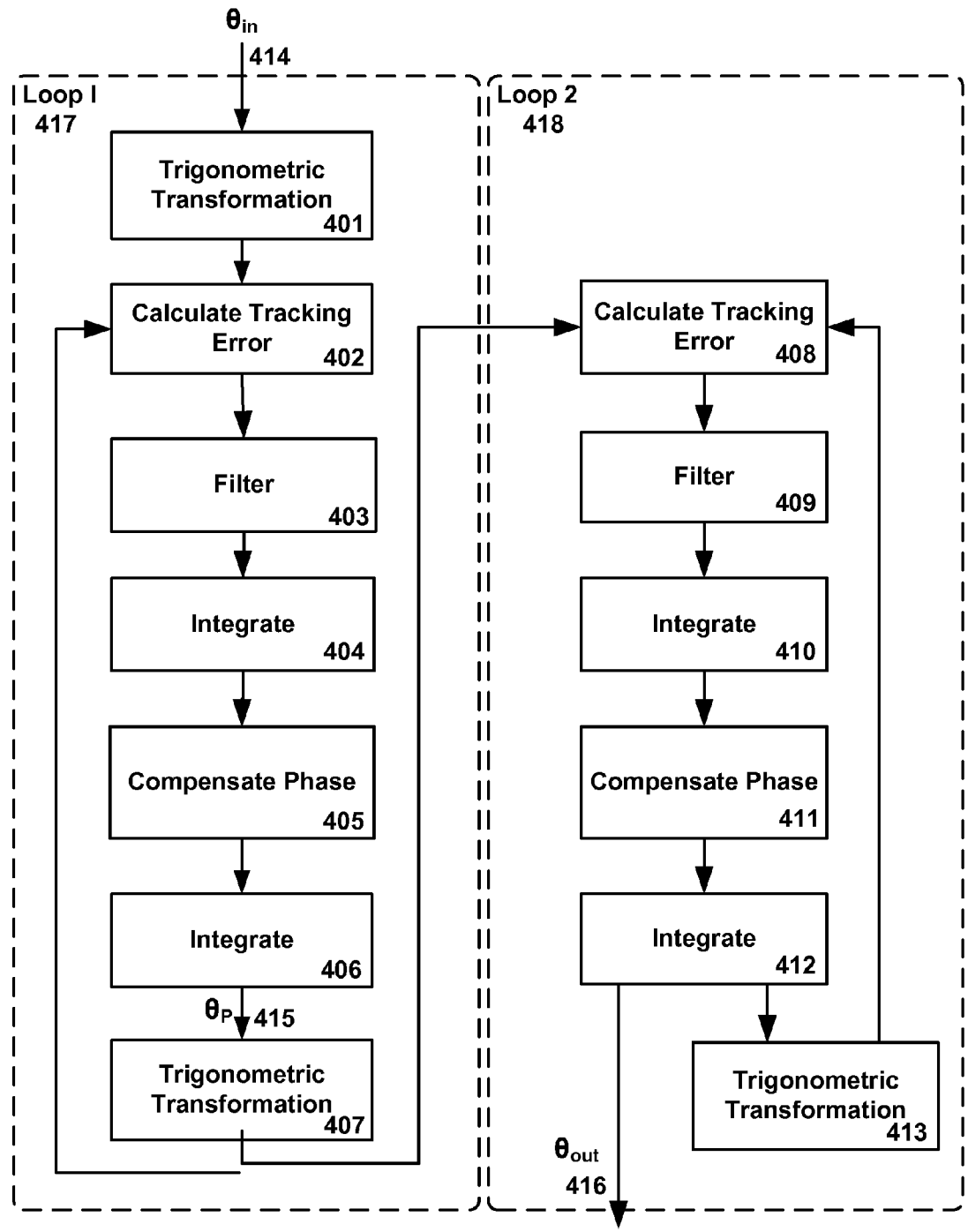
FIG. 4 is a simplified flow diagram illustrating general operation of an embodiment of a method of attenuating carrier frequencies with a cascaded tracking loop filter.

FIG. 4 is a simplified flow diagram illustrating general operation of one embodiment of a method of attenuating carrier frequencies with a cascaded tracking loop filter. As shown, a method of attenuating carrier frequencies with a cascaded tracking loop filter may include, at block 401, trigonometrically transforming a received signal that represents the phase (θ) of a resolver as calculated by an RDC. Transforming the received signal θin may be achieved with any of a variety of transformation methods. Trigonometrically transforming θin may have the additional effect of smoothing the input signal or improving the resolution of θout by interpolating additional bits with a multi-bit trigonometric converter.

After transforming θin, the tracking error existent in θin may be calculated at block 402. The tracking error may be calculated by comparing transformed θin with a similarly transformed predicted value of θin, θp, and deriving an error value that determines how much θin is out of phase. The tracking loop may then attempt to drive the tracking error to zero by filtering, integrating and compensating the tracking error existent in transformed θin.

After calculating the tracking error, the tracking error may be filtered at block 403 to filter high-frequency noise from θin. In an embodiment, filtering may be performed with a low pass first order filter or other similar filter.

After filtering the carrier harmonics, the tracking error may be integrated at block 404. The integration may perform a discrete time transform that acts as an accumulator and may create inertia within the tracking error of θin to small errors. Limiting the tracking error in θin may additionally serve to attenuate the frequencies of the carrier harmonics in θin.

As shown, the loop 417 may be implemented with a feedback loop, i.e. the output of the loop (predicted phase θp) may be fed back into the loop as an input for calculating tracking error at block 402. However, a phase shift in the feedback loop 417 may cause oscillation if the phase shift reaches 360°. Compensating the phase in the loop may prevent undesirable oscillation. Phase compensation may be implemented at block 405 to counter the phase shift that may be introduced into the tracking error when calculating tracking error at block 402, integrating the tracking error at blocks 404 and 406, and filtering at block 403. In an embodiment, the phase compensation implemented at block 405 may introduce a phase lead such that the total lead/lag in loop 417 does not reach 360°.

After compensating for a phase shift, the tracking error may again be integrated at block 406. As with block 404 the integration at block 406 may include performing a discrete time transform that acts as an accumulator. The compensation at block 405 may anticipate the subsequent integration and adjust for the phase shift that may be introduced into the signal at block 406.

After the integration of block 406, the tracking error in θin may be reduced and the output, θp', may then be a prediction of the current rotor angle of the resolver. By reducing the tracking error with the integration at blocks 404 and 406, θp' may be a reasonably accurate prediction free from significant group delays. θp' may then be transformed at block 407 as in block 401. The second transformation at block 407 may include determining the sine and cosine trigonometric transformation of θp'. Then sin(θp') and cos(θp') may be fed back into block 402 and may be used in the calculation of the tracking error when combined with the next input value, θin'.

θp' may be a sufficiently attenuated prediction of the rotor angle and additional tracking loops may not be required. However, as shown in FIG. 4, multiple tracking loops may be implemented in a cascading setup to further filter the carrier harmonics in the signal. If second loop 418 is implemented with the same features of the first loop 417, the trigonometric transformation at block 407 may also serve as the first trigonometric transformation of second loop 418. Second loop 418 may behave substantially similar to loop 418 with θp' as θin. Then blocks 408, 409, 410, 411, and 412 may alter θp' similarly to blocks 402, 403, 404, 405, and 406 respectively.

Thus, sin(θp') and cos(θp') may also be input into block 408. At block 408, the tracking error existent in θp' may be calculated by comparing transformed θp' with a similarly transformed predicted value of θp', (gout, and deriving an error value that determines how much θp' is out of phase. Then blocks 409, 410, 411, and 412 may filter, integrate and compensate θp' such that θout' may then represent a current prediction of the rotor angle of the resolver with attenuated carrier frequencies. Another trigonometric transformation of θout' may then be calculated at block 413. Then sin(θout') and cos(θout') may be fed back into tracking error calculator 408 of second loop 418 to be combined with the next θp".

It is noted that the arrangement of the blocks in FIG. 4 does not necessarily imply a particular order or sequence of events, nor is it intended to exclude other possibilities. For example, the operations depicted at blocks 404, 405 and 406 may occur in another order or substantially simultaneously with each other.

Figure 5:
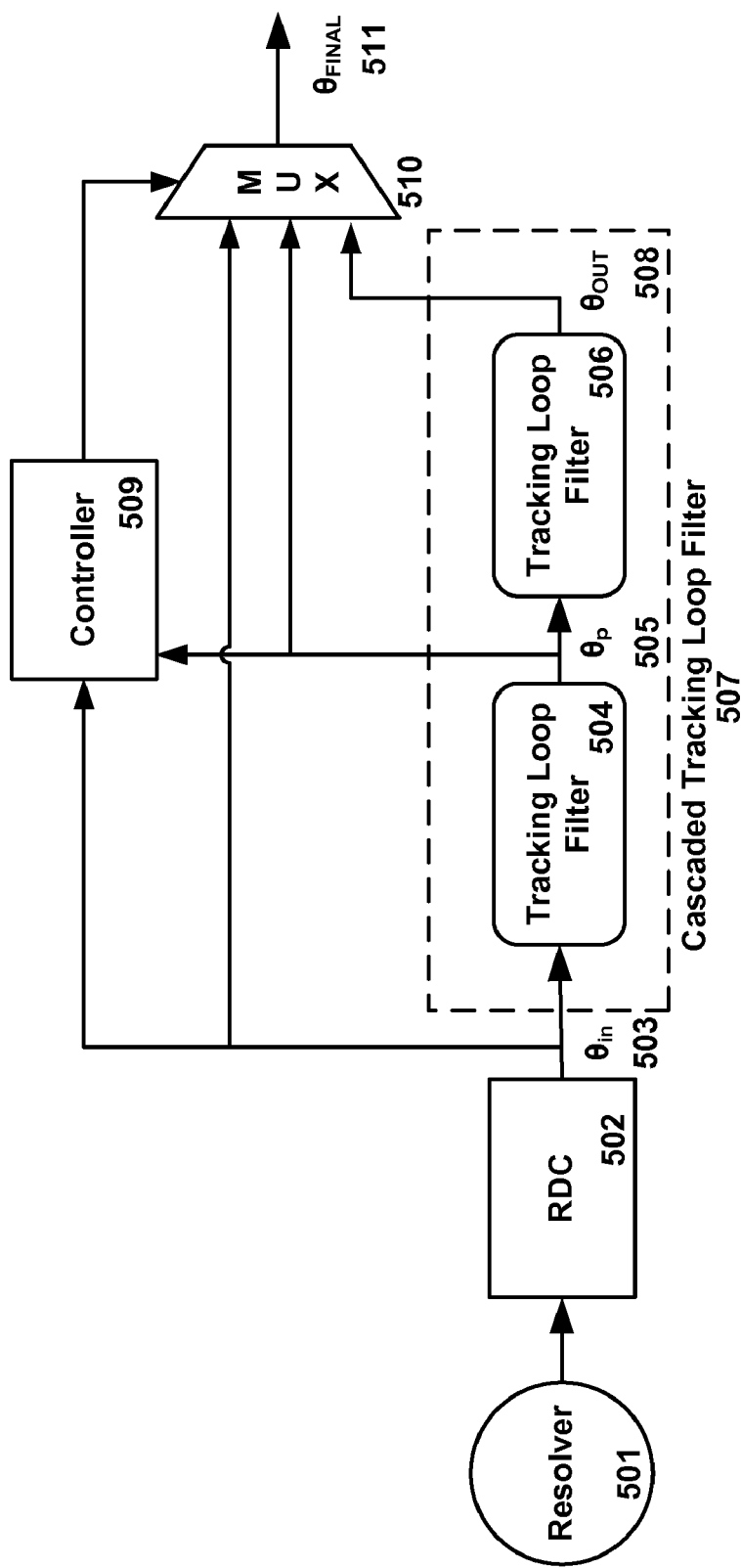
FIG. 5 is a simplified block diagram illustrating components of an embodiment of an RDC system implemented with a controller to selectively activate one or more tracking loop filters in a cascaded tracking loop filter.

FIG. 5 is a simplified block diagram illustrating components of an embodiment of an RDC system implemented with a controller to selectively activate one or more tracking loop filters in a cascaded tracking loop filter. As shown, an embodiment of an RDC system 500 may include a resolver 501, an RDC 502, a cascaded tracking loop filter 507, a controller 509, and a multiplexer 510. The controller 509 may determine when and how many tracking loop filters should be engaged in the cascaded tracking loop filter 507 and pass instructions to the multiplexer 510. The multiplexer 510 may then select for output as θfinal one of multiple inputs according to the instructions from the controller 509.

As previously noted, a cascaded tracking loop filter 507 may include multiple tracking loop filters, shown in FIG. 5 as tracking loop filters 504 and 506. In an embodiment, multiple tracking loop filters may be implemented where the number of tracking loop filters engaged at any given time may be variable. However, if the cascaded tracking loop filter 507 is engaged when the rotational velocity of the rotor is not constant, some positional error may be introduced with each loop. Controller 509 may monitor the θin signal output from the RDC 502 to detect changes in the velocity of the rotor and to determine if a change in the velocity is due to jitter or low level harmonics or if the change is due to acceleration or deceleration of the rotor. The controller 509 may additionally directly monitor the output from the resolver 501 to detect the rotor velocity as needed.

If a change in the detected velocity of the rotor may be attributed to jitter or low level harmonics, the controller 509 may engage the cascaded tracking loop filter 507 to smooth the output position signal and attenuate carrier harmonics. When the cascaded tracking loop filter is engaged, the multiplexer 510 may select θout as the θfinal output. If a change in the detected velocity may be attributed to acceleration or deceleration of the rotor, the controller 509 may disengage the cascaded tracking loop filter 507. When the cascaded tracking loop filter 507 is disengaged, the multiplexer 510 may select θin as the θfinal output.

Because some positional error may be introduced with each loop if the rotational velocity of the rotor is not constant, each successive loop may increase the positional error. Controller 509 may monitor the intermediate phase prediction values of the cascaded tracking loop filter 507 to limit unnecessary filtering that may induce positional error and may determine if additional filtering is required. The controller may limit the potential for positional error by disengaging unnecessary tracking loop filters. For example, if the controller determines that θp is sufficiently filtered, the controller may disengage any tracking loop filters further in the cascade (i.e. tracking loop filter 506 may be selectively disengaged). When the second tracking loop filter 506 is disengaged, the multiplexer 510 may select θp as the θfinal output.

As shown, a cascaded tracking loop filter is implemented in an RDC system. However, a cascaded tracking loop filter may have uses in other applications that require filtering. For example, cascaded tracking loop filter may effectively filter other bounded or sinusoidal signals.

While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. A system comprising:
   a resolver-to-digital converter (RDC) having an input for a resolver signal and an output for a digital representation of the resolver signal;
   a tracking loop filter coupled to an output of the RDC; and
   a controller to estimate a rotational velocity of the resolver signal and to disengage the tracking loop filter selectively based on the estimated velocity.

2. The system of claim 1, wherein the tracking loop filter includes a pair of loop filters provided in cascade.

3. The system of claim 1, wherein the RDC and tracking loop filter are provided in a common integrated circuit.

4. The system of claim 1, wherein the tracking loop filter comprises:
   a first trigonometric transform unit having an input coupled to the RDC output, to generate sinusoidal representations of the RDC output,
   a second trigonometric transform unit to generate local sinusoidal representations,
   an error calculator having inputs coupled to the first and second transform units,
   a filter/integrator chain having an input coupled to an output of the error calculator and an output coupled to an input of the second trigonometric transform unit.

5. A tracking loop filter comprising:
   a first trigonometric conversion unit for converting an input phase value into a first trigonometric value;
   a second trigonometric conversion unit for converting a predicted value of the input phase value into a second trigonometric value;
   an error calculation unit for calculating a tracking error value from the first trigonometric value and the second trigonometric value;
   a first and a second integration unit to reduce the tracking error value;
   a filter to reduce noise in the tracking error value; and
   a compensation unit to prevent feedback loop oscillation;
   wherein the integrated, filtered, and compensated tracking error value is converted into the predicted value of the input phase value.

6. The tracking loop filter of claim 5 wherein said filter is a low pass filter.

7. The tracking loop filter of claim 5 wherein said first and second trigonometric conversion units comprise a first and a second digital frequency synthesizer.

8. The tracking loop filter of claim 7 wherein said first digital frequency synthesizer interpolates a plurality of bits to improve a resolution of the input phase value.

9. The tracking loop filter of claim 5 wherein said first and second trigonometric conversion units comprise a first and a second look-up table.

10. A system comprising:
    a resolver-to-digital converter (RDC) to derive a digital representation of a shaft angle of a resolver; and
    a tracking loop filter according to claim 5 to filter the digital representation.

11. The system of claim 10 further comprising a second tracking loop filter according to claim 1; wherein an output of said tracking loop filter is an input into said second tracking loop filter.

12. The system of claim 11 wherein the second trigonometric conversion unit of said tracking loop filter is the first trigonometric conversion unit of said second tracking loop filter.

13. The system of claim 11 wherein said tracking loop filter and said second tracking loop filter may be selectively engaged.

14. A method comprising:
converting an input phase value into a first trigonometric value;
calculating a tracking error value using the first trigonometric value and a second trigonometric value received as a feedback prediction of the input phase value;
filtering a noise value from the tracking error value;
first integrating the filtered tracking error value;
applying a compensation value to the integrated tracking error value to prevent feedback loop oscillation;
second integrating the compensated tracking error value;
converting the filtered, compensated, and integrated tracking error value into a predicted phase value; and
converting the predicted phase value into the second trigonometric value for feedback.

15. The method of claim 14 wherein said filtering further compromises low pass filtering the tracking error.

16. The method of claim 14 wherein said converting the input phase value comprises calculating the first trigonometric value with a first digital frequency synthesizer.

17. The method of claim 16 wherein said calculating further comprises interpolating a plurality of bits to improve a resolution of the input phase value.

18. The method of claim 14 wherein said converting the input phase value comprises calculating the first trigonometric value with a look-up table.

19. A method comprising:
deriving a digital representation of a shaft angle of a resolver with a resolver-to-digital converter (RDC); and
filtering the digital representation according to the method of claim 14.

20. The method of claim 19 further comprising second filtering the filtered digital representation according to the method of claim 14.

\* \* \* \* \*